United States Patent [19]
Burke et al.

[11] Patent Number: 5,105,248
[45] Date of Patent: Apr. 14, 1992

[54] SPATIAL LIGHT MODULATOR USING CHARGE COUPLED DEVICE WITH QUANTUM WELLS

[75] Inventors: Barry E. Burke, Lexington; William D. Goodhue, Jr.; Kirby B. Nichols, both of Chelmsford, all of Mass.

[73] Assignee: Massachusetts Institute of Technology, Cambridge, Mass.

[21] Appl. No.: 463,839

[22] Filed: Jan. 11, 1990

Related U.S. Application Data

[63] Continuation of Ser. No. 50,197, May 14, 1987, abandoned.

[51] Int. Cl.$^5$ .................. H01L 29/78; H01L 29/205; G02B 6/10; G02F 1/01
[52] U.S. Cl. .......................... 357/24; 357/16; 359/240; 385/8
[58] Field of Search ............... 357/16, 24; 350/96.14, 350/355, 50, 197

[56] References Cited

U.S. PATENT DOCUMENTS

| | | | |
|---|---|---|---|
| 4,163,237 | 7/1979 | Dingle et al. | 357/16 |
| 4,348,686 | 9/1982 | Esaki et al. | 357/30 E |
| 4,424,525 | 1/1984 | Mimura | 357/24 M |
| 4,550,331 | 10/1985 | Milano | 357/24 M |
| 4,561,005 | 12/1985 | Shannon | 357/24 LR |
| 4,679,061 | 7/1987 | Capasso et al. | 357/30 E |
| 4,683,484 | 7/1987 | Derkits | 357/24 M |
| 4,696,533 | 9/1987 | Kingston et al. | 350/96.14 |
| 4,705,361 | 11/1987 | Frazier et al. | 350/355 |

OTHER PUBLICATIONS

Goodhue et al "Quantum-Well Charge-Coupled Devices for Charge-Coupled Device-Addressed Multiple-Quantum-Well Spatial Light Modulators", J. Vac. Sci. Technology B, vol. 4 (May/Jun. 1986) pp. 769-772.

*Primary Examiner*—Gene M. Munson
*Attorney, Agent, or Firm*—Robert F. O'Connell

[57] ABSTRACT

An electro-optical device comprising a CCD structure having charge wells, the charges therein being controlled by a modulating signal applied to said CCD structure. A multiple quantum well structure having quantum well regions associated with the charge wells of said CCD structure, the charges in the CCD charge wells determining the value of the electric fields at said quantum well regions and, hence, the electro-absorption effects at said quantum well regions. The intensity of an input electromagnetic wave signal directed through said electro-optical device is thereby spatially modulated by the electro-absorption effects at the quantum well regions of the multiple quantum well structure. A novel CCD structure using quantum well regions to form the charge wells thereof can be used as the CCD structure for controlling the electric fields at the multiple quantum well structure.

14 Claims, 1 Drawing Sheet

SPATIAL LIGHT MODULATOR USING CHARGE COUPLED DEVICE WITH QUANTUM WELLS

This is a continuation of copending application Ser. No. 07/050,197 filed on May 14, 1987, abandoned.

INTRODUCTION

This invention relates generally to spatial light modulators and, more particularly, to semiconductor spatial light modulators using charge-coupled devices for controlling the electric field applied to a multiple quantum well (MQW) structure within the semiconductor substrate so as to control the electro-absorption of an electromagnetic wave transmitted therethrough by such MQW structure.

BACKGROUND OF THE INVENTION

Devices for controlling the spatial distribution of the intensity of electromagnetic waves, such as light, are often designated as spatial light modulators (SLM's). Such devices which can be used in processing data are capable of spatially modulating a collimated coherent or incoherent beam of light with, for example, input data which is to be processed. The devices are appropriately coupled to optical data processing systems into which the data modulated light beam is supplied at a rate commensurate with the processing system's potential throughput, the optical processing system utilizing parallel processig without the limitations normally imposed by serial manipulation of the data.

Many different forms of spatial light modulators have been suggested by those in the art. An early article, entitled "Spatial Light Modulators", by David Casasent and published in the Proceedings of the IEEE, Vol. 65, No. 1, January 1977, at pages 143-157, provides a summary of various types of spatial light modulators that have been suggested by the art. The devices described therein include SLM's using liquid crystal materials; materials which undergo surface deformation patterns (sometimes referred to as deformable SLM's), i.e., thermoplastic materials, dielectric oils, ruticon, or elastomers, or membranes combined with surface channel charged coupled devices (CCD's); alkali halide materials having intentionally introduced color center defects (sometimes referred to as photodichroic SLM's); materials which exhibit the Pockels effect (sometimes referred to as Pockels SLM's); materials using ferroelectric-photoconductor characteristics; materials using ferroelectric-photorefractive characteristics; and SLM's using acousto-optic techniques, magneto-optic techniques, techniques utilizing the characteristics of amorphous semiconductor materials; and techniques using magnetic-bubble devices. A later less detailed, up-dated summary was more recently published. Such article, entitled "A Review of Spatial Light Modulation", by A.D. Fisher, presented at the Topical Meeting on Optical Computing, sponsored by the Optical Society of America, at Incline Village, Nevada, Mar. 18-20, 1985, briefly discusses various devices and the general status of the art at that time.

In most cases, however, the devices discussed in the art are only optically addressable by using a scanning light beam, for example, or electron beam addressable by using a scanning electron beam. Such devices are cumbersome and expensive to fabricate and are slow in operation. Of the relatively few types of devices which are electrically addressable, such as devices which use membranes deflected by electrical signals which are supplied through electrodes in contact with the membrane or devices which use membranes combined with charged coupled devices, the structure thereof is extremely difficult to fabricate and the membrane response is relatively slow so that such devices are not readily usable for high speed, real-time processing operations.

A spatial light modulator which operates in real time and which is primarily, and often preferably, electrically addressable or, alternatively, is optically addressable, has been disclosed in U.S. patent application Ser. No. 224,140, filed on Jan. 12, 1981 by R. H. Kingston and F. Leonberger, now issued as U.S. Pat. No. 4,696,533 on Sept. 27, 1987. The spatial light modulator disclosed therein is a relatively compact device handling a relatively large amount of input data in a relatively small volume, the device being capable of operation at high speeds, using up to as high as $10^9$ data samples per second. The device utilizes a suitable substrate having a "buried channel" charge-coupled device (CCD) formed at a surface of the substrate. The amount of charge in the charge storage wells associated with a plurality of electrodes of the buried channel CCD is controlled by an electrically or optically addressed data signal. In the specific embodiment disclosed therein, the level of charge in such charge storage wells thereby controls the electric field beneath the electrodes such that the transmitted light is spatially modulated by the charge levels in the charge storage wells in accordance with the Franz-Keldysh electro-absorption effect.

A problem with such a device is that the amount of modulation of an electromagnetic wave that can be achieved is very limited when using the Franz-Keldysh effect, e.g., modulation levels of less than 20%-30% can be obtained. It is desirable that much greater electro-absorption effects be achieved, while still maintaining the ability to do so for a two-dimensional (2D) wave using a 2D array of such devices.

BRIEF SUMMARY OF THE INVENTION

In accordance with the invention a spatial light modulator has been devised using a multiple quantum well (MQW) structure which can produce a relatively much stronger electro-absorption effect than that achievable by the Franz-Keldysh effect. While such structures have been described in the art, e.g., in the article "High-speed Optical Modulation with GaAs/AlGaAs Quantum Wells in a P-I-N- Diode Structure" by T. H. Wood et al., *Applied Physics Letters*, Vol. 44, page 16, January 1984, the only technique disclosed for controlling the electro-absorption effect, and hence the modulation of an electromagnetic wave, is that of applying a varying voltage directly to the doped layers positioned adjacent the surfaces of an MQW structure, an incoming electromagnetic wave signal being applied to the structure orthogonally thereto at one of the doped surfaces thereof.

In contrast to the device described in the above Wood et al. article, the invention makes use of one or more multiple quantum well structures and an additional charge well structure for controlling the electric fields thereof so as to control the electro-absorption effect provided by the multiple quantum wells to permit the spatial modulation of a one-dimensional or a two-dimensional input wave of electromagnetic energy. In accordance therewith, the structure utilizes a charge-coupled device (CCD), the charge wells of which are used to control the electric fields of an MQW structure. The CCD wells are charged by applying a suitable modulation signal to the CCD structure by electrically or optically addressing the electrodes thereof.

Accordingly, an incoming electromagnetic wave signal applied to the overall structure for transmission therethrough is spatially modulated by the electroabsorption effect produced by the MQW structure which is controlled in accordance with the applied modulation signal. If a 2D array of MQW structures is used with an associated 2D array of CCD structures, a two-dimensional input electromagnetic wave can be spatially modulated as desired by suitably addressing the CCD structures to control the charges of the CCD wells and hence the electric fields of the MQW structures.

In a preferred embodiment thereof, the structure of a spatial light modulator of the invention uses a plurality of alternating layers of GaAs and AlGaAs to form an MQW structure on a ground plane layer of a doped AlGaAs material. One or more alternating layers of GaAs and AlGaAs are positioned beneath a Schottky barrier CCD electrode structure to further form a quantum well, charge-coupled device (QWCCD) structure which is associated with the MQW structure. The electrodes of the QWCCD are addressed (electrically or optically) by a suitable modulation signal so as to form charges in the CCD quantum wells which charges represent such modulation signal. The CCD quantum well charges thereupon control or modulate the value of the electric field which is applied to the MQW structure so as to control the electro-absorption effect of the MQW in accordance with such modulated electric field. The intensity of an incoming electromagnetic wave signal is thereby modulated by the modulated, or spatially varied, electro-absorption effect so that the incoming wave signal is spatially modulated thereby so as to produce a spatially modulated wave signal at the output of the overall device.

DESCRIPTION OF THE INVENTION

The invention can be described more specifically with the use of the accompanying drawings wherein FIG. 1 shows in diagrammatic form one preferred embodiment of a device in accordance with the invention;

Figure 1:
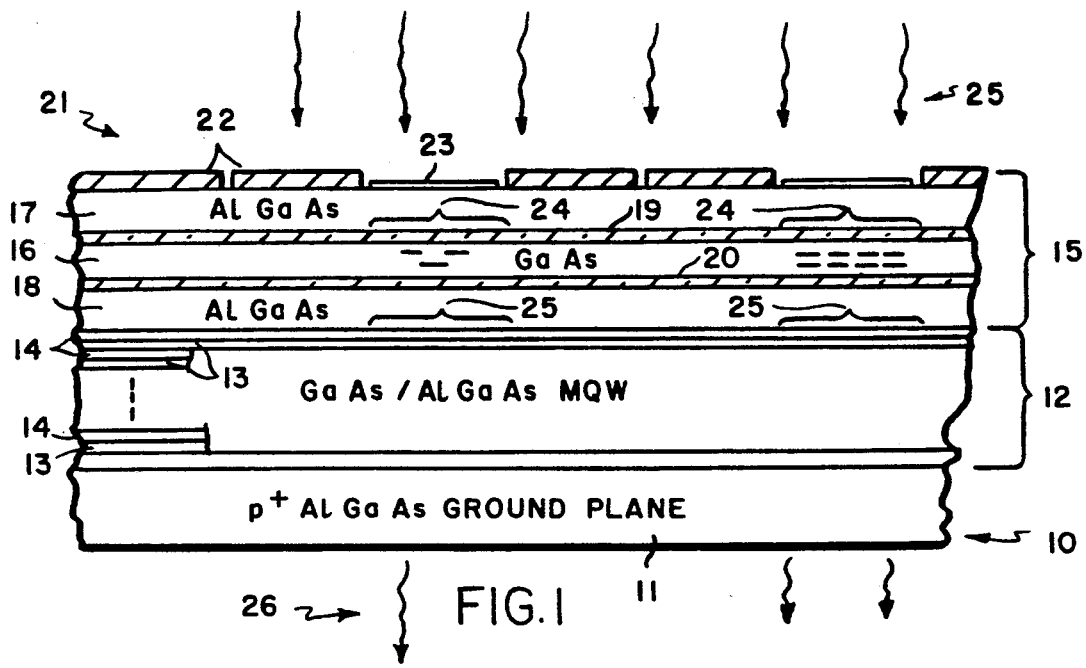

FIG. 1 shows a diagrammatic representation of a portion of an electro-optical device 10 representing one preferred embodiment of the invention. As can be seen therein the device includes a ground plane layer 11 which is in the form, for example, of a p-doped AlGaAs layer. A multiple quantum well (MQW) structure 12 is formed above ground plane 11 and comprises a plurality of alternating layers 13 and 14, respectively, of AlGaAs and GaAs. The formation of MQW 12 is well known to those in the art as described, for example, in the aforesaid article of Wood et al.

A novel quantum well, charge coupled device (QWCCD) 15 comprises a GaAs layer 16 having isolation AlGaAs layers 17 and 18 on either side thereof. A pair of n-doped layers 19 and 20 of AlGaAs are positioned immediately adjacent GaAs layer 16 between such layer and isolation layers 17 and 18. GaAs layer 16 and n-AlGaAs layers 19 and 20 form a quantum well channel of the QWCCD structure 15. Schottky barrier gate electrodes 21 for the QWCCD structure are deposited at the exposed surface of layer 17 and comprise opaque electrodes 22 and transparent electrodes 23 as would be well known to the art. Accordingly, the regions 24 of the CCD quantum well channel form electron-confining, or charge, well regions thereof, as depicted.

Techniques for the growth of such would be well within the skill of the art using known processes such as, for example, a molecular beam epitaxy process, and need not be described in detail here. While preferably the ground plane layer is p-doped and the layers 19 and 20 are n-doped, it is possible to form the ground plane as an n-doped layer in which case layers 19 and 20 will be p-doped.

The thickness of the GaAs layer 16 may be within a range from about 50 Å to about 200 Å, while the exemplary thickness of the n-AlGaAs layers 19 and 20 may be within a range from a few Å up to about 500 Å, and preferably less than 200 Å. The thickness of isolation layers 17 and 18 is not critical and each may be within an exemplary range from about 1000 Å to about 5000 Å. The thickness of the alternating layers 13 and 14 may be within an exemplary range from about 100 Å to about 300 Å, for example, the GaAs layers 14 being within a range from about 100 Å to about 150 Å and the AlGaAs layers 13 being within a range from about 100 Å to about 300 Å.

In accordance with the device shown in FIG. 1, an incoming electromagnetic wave, shown diagrammatically by wavy lines 25, can be applied orthogonally to the surface of device 10 containing the CCD gate electrodes. A modulating electrical signal can be clocked into the CCD electrodes as discussed, for example, in the aforesaid Kingston and Leonberger patent application using appropriate input circuitry known to the art, an example of which is shown in such application. The signal so clocked in produces charges in the quantum wells of the QWCCD structure in accordance with the varying signal value of the modulating signal at the transparent electrodes of the CCD gate electrodes, as shown qualitatively in the drawing.

The charges stored in the quantum wells 24 of the QWCCD structure control the value of the electric field at the quantum well regions 26 of the MQW structure 12 corresponding to such CCD quantum well regions, so that the electro-absorption which occurs at such regions of the MQW structure 12 varies in accordance with such electric field. Accordingly, the intensity of an incoming wave 25 is spatially modulated at each such controlled electro-absorption region as it is transmitted through the overall device, to produce a spatially modulated output wave as shown by the wavy lines 27.

The device shown in FIG. 1 preferably uses the novel QWCCD structure 15 as depicted therein for controlling the electric field of the MQW structure 12 since it requires only a relatively thin channel layer and thus avoids the tendency to trap the charges as the modulating signal is clocked in. Such a structure tends to better preserve the integrity of the charge packets at the quantum wells. Moreover, the use of such a thin channel layer provides a relatively fast response to the incoming wave which is to be spatially modulated and provides a relatively high speed of operation, as compared, for example, to that of the structure disclosed in the aforesaid Kingston and Leonberger application.

Alternative CCD charge well structures can also be used to control the electric fields of the MQW structure within the spirit and scope of the invention. Thus a conventional CCD structure, as disclosed in the aforesaid Kingston and Leonberger application, can also be used, the charge wells thereof corresponding to the quantum wells of the QWCCD structure 12. Such alternative CCD structure requires overall a thicker layer than the QWCCD of FIG. 1, but is a relatively simple structure to fabricate and use and may be equally acceptable in some applications.

Moreover, while such CCD structures may normally use Schottky barrier electrodes, as depicted in FIG. 1, in some instances it should be possible alternatively to use p/n junction diodes instead as the CCD electrode structures.

Figure 2:
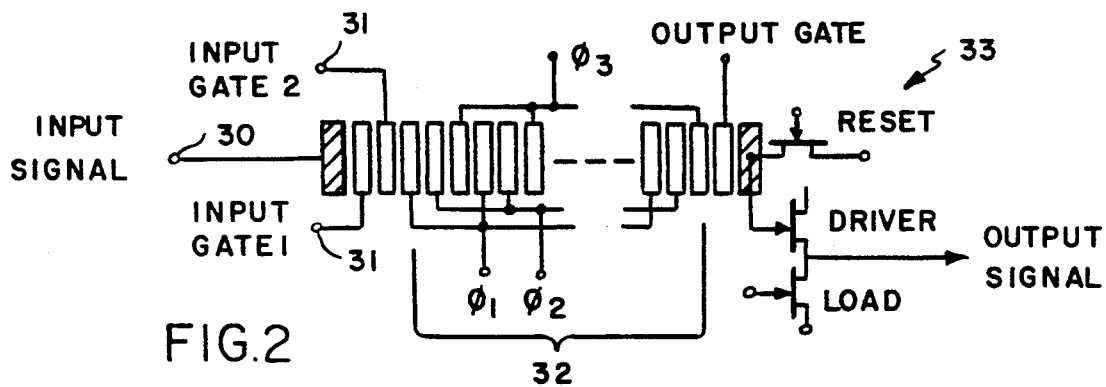
FIG. 2 shows a diagrammatic circuit of a typical QWCCD as used in the embodiment of FIG. 1.

FIG. 2 shows a schematic diagram of a typical three-phase (3), 16-stage QWCCD made in accordance with the invention for controlling the electric field of an associated MQW structure (not shown in FIG. 2) formed on the same device. As can be seen therein, an input signal is applied via an input ohmic contact 30 and input gates 31. Sixteen, 3-phase stages of CCD electrodes 32 are provided, together with an output circuit 33 comprising an output gate and suitable driver, load and reset transistor circuitry, for clocking out the CCD signal. The output circuit can utilize high-electron-mobility-transistors (HEMT's), for example, as would be well-known to the art.

Figure 3:
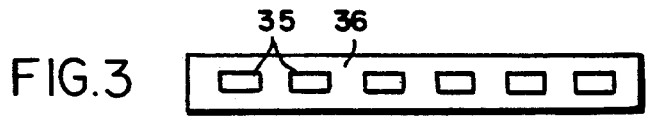
FIG. 3 shows a device of the invention used to provide one-dimensional modulation.
Figure 4:
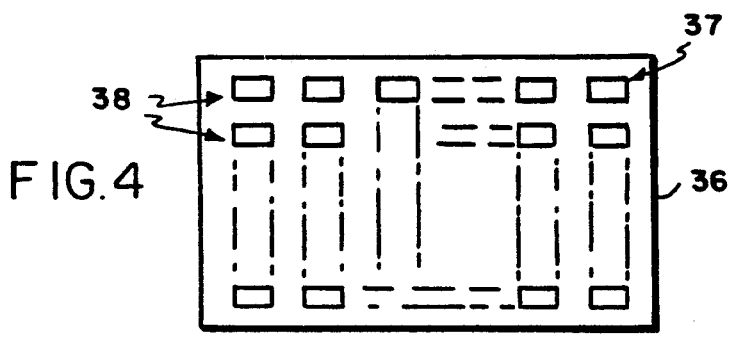
FIG. 4 shows a plurality of devices of the invention used to provide two-dimensional modulation.

The particular embodiment pictured in FIGS. 1 and 2 shows a device which can be used for providing modulation of a one-dimensional electromagnetic wave signal applied thereto. As shown in FIG. 3, the invention can be used to form an elongated device 35 having a plurality of opaque/transparent electrode groups 36. The invention can also be used for two-dimensional modulation, as depicted in FIG. 4. As seen therein a 2D array 37 comprises a plurality of rows of one-dimensional arrays 38. The desired modulating signals can be suitably clocked into each of the arrays 38 to form an overall 2D array of clocked signals which vary the charges in the charge wells of whatever CCD structure is used and, hence, are used to control the electric fields of the associated MQW structures thereof so that, in effect, a 2D electro-absorption modulation characteristic can be achieved in the device. The intensity of an incoming 2D waveform signal applied at an input surface thereof is then appropriately modulated so as to provide a spatially modulated 2D waveform output signal at the opposite output surface of the device.

While the quantum well structures discussed above for the MQW and the QWCCD structures use GaAs and AlGaAs as the materials therefor, other materials having appropriate dissimilar energy band characteristics can also be used. For example, GaAs and InGaAs materials or GaInAs and AlInAs materials can also be used.

All of the various embodiments of spatial modulators, spatial or time modulated correlators, or matched filter devices, and the like, as discussed in the aforesaid Kingston and Leonberger application can also be made using the structure and operation of a spatial modulator in accordance with the invention.

While the embodiments disclosed above represent preferred embodiments of the invention, modifications thereof will occur to those in the art within the spirit and scope of the invention. Hence, the invention is not to be construed as limited to the particular embodiments described except as defined by the appended claims.

What is claimed is:

1. An electro-optical device for providing spatial modulation of an incoming electromagnetic wave signal comprising
    a charge-coupled device being formed in said device and having a plurality of electrodes and a plurality of charge well regions associated with said electrodes for containing electric charges;
    a multiple quantum well structure being formed in said device and having a plurality of quantum well regions corresponding to the charge well regions of said charge-coupled device, said quantum well regions having dimensions such that said regions exhibit localized quantum size effects, the charges in said charge well regions of the charge-coupled device determining the value of the electric fields at said quantum well regions, and the electro-absorption effects at said quantum well regions varying in accordance with said electric fields, the intensity of an input electromagnetic wave signal directed through said electro-optical device thereby being spatially modulated by the electro-absorption effects at said quantum well regions of said multiple quantum well structure.

2. An electro-optical device in accordance with claim 1 wherein
    said charge-coupled device is a quantum well, charged-coupled device comprising
    a plurality of electrodes; and
    a plurality of charge wells associated with said electrodes, said charge wells being formed as quantum well regions.

3. An electro-optical device in accordance with claim 2 wherein the quantum well regions of said charge-coupled device are formed by alternating layers of materials having dissimilar energy characteristics, at least one of said layers acting as a source of electric charges for said quantum well regions.

4. An electro-optical device in accordance with claim 3 wherein said materials comprise at least one layer of GaAs and at least one layer of n-AlGaAs acting as a source of said electric charges.

5. An electro-optical device in accordance with claim 3 wherein said materials comprise at least one layer of GaAs and at least one layer of n-InGaAs acting as a source of said electric charge.

6. An electro-optical device in accordance with claim 3 wherein said materials comprise at least one layer of GaInAs and at least one layer of AlInAs acting as a source of said electric charge.

7. An electro-optical device in accordance with claim 1 wherein said electrodes are formed as Schottky barrier electrodes.

8. An electro-optical device in accordance with claim 1 wherein said multiple quantum well structure comprises a plurality of alternating layers of materials having dissimilar energy characteristics forming a plurality of quantum well regions for storing electric charges so as to produce electro-absorption effects at said quantum well regions.

9. An electro-optical device in accordance with claim 8 wherein said alternating layers of materials comprise GaAs and AlGaAs.

10. An electro-optical device in accordance with claim 8 wherein said alternating layers of materials comprise GaAs and InGaAs.

11. An electro-optical device in accordance with claim 8 wherein said alternating layers of materials comprise GaInAs and AlInAs.

12. An electro-optical device in accordance with claim 1 wherein said charge-coupled device and said multiple quantum well structure are arranged to provide a one-dimensional array of said charge wells and said associated multiple quantum well regions so as to provide electro-absorption effects for spatially modulating an incoming one-dimensional electromagnetic wave signal.

13. An electro-optical system comprising a plurality of electro-optical devices, each of said devices including a charge-coupled device being formed in said device and having a plurality of electrodes and a plurality of charge well regions associated with said electrodes for containing electric charges;

a multiple quantum well structure being formed in said device and having a plurality of quantum well regions corresponding to the charge well regions of said charge-coupled device, the charges in said charge well region determining the value of the electric fields at said quantum well regions and, hence, the electro-absorption effects at said quantum well regions;

the charged-coupled devices and multiple quantum well structures of said plurality of electro-optical devices being arranged to provide a two-dimensional array of said charge wells and said associated multiple quantum well regions so as to provide electro-absorption effects for spatially modulating an incoming two-dimensional electromagnetic wave signal.

14. An electro-optical device in accordance with claim 1 and further including means for supplying a modulating signal to said charge-coupled device, said modulating signal thereby controlling the charges in the charge wells of said charge-coupled device.

* * * * *